(12) United States Patent
Deng (10) Patent No.: US 11,249,215 B2
(45) Date of Patent: *Feb. 15, 2022

(54) FOLDABLE PORTABLE METAL DETECTOR HAVING A QUICKLY REPLACEABLE DETECTION COIL DISK

(71) Applicant: Maoquan Deng, Shenzhen (CN)

(72) Inventor: Maoquan Deng, Shenzhen (CN)

( * ) Notice: Subject to any disclaimer, the term of this patent is extended or adjusted under 35 U.S.C. 154(b) by 80 days.

This patent is subject to a terminal disclaimer.

(21) Appl. No.: 16/837,987

(22) Filed: Apr. 1, 2020

(65) Prior Publication Data

US 2021/0116595 A1  Apr. 22, 2021

Related U.S. Application Data

(63) Continuation-in-part of application No. PCT/CN2019/111696, filed on Oct. 17, 2019.

(51) Int. Cl.
| | | |
|---|---|---|
| *G01V 3/17* | (2006.01) | |
| *G01R 33/00* | (2006.01) | |
| *G01V 3/10* | (2006.01) | |
| *F16M 11/04* | (2006.01) | |
| *G01V 3/15* | (2006.01) | |
| *H01R 13/52* | (2006.01) | |

(52) U.S. Cl.
CPC ............ *G01V 3/17* (2013.01); *F16M 11/046* (2013.01); *G01R 33/0047* (2013.01); *G01V 3/104* (2013.01); *G01V 3/15* (2013.01); *H01R 13/5213* (2013.01)

(58) Field of Classification Search
CPC ...... G01R 33/0047; G01V 3/104; G01V 3/17; G01V 3/15; G01V 3/10; G01V 3/165
See application file for complete search history.

(56) References Cited

U.S. PATENT DOCUMENTS

| | | | | |
|---|---|---|---|---|
| 3,662,255 A | * | 5/1972 | Garrett | G01V 3/15 |
| | | | | 324/328 |
| 5,132,622 A | * | 7/1992 | Valentino | A63B 24/0021 |
| | | | | 324/326 |
| 2004/0000918 A1 | * | 1/2004 | Sanoner | G01V 3/088 |
| | | | | 324/671 |
| 2016/0091629 A1 | * | 3/2016 | Deng | G01V 3/10 |
| | | | | 324/329 |
| 2017/0299756 A1 | * | 10/2017 | Weaver | G01V 3/165 |
| 2018/0335540 A1 | * | 11/2018 | Loubet | G01V 3/15 |

* cited by examiner

*Primary Examiner* — Jay Patidar
(74) *Attorney, Agent, or Firm* — Analects Legal LLC (57) ABSTRACT

The present disclosure provides a foldable portable metal detector including: a detection coil disk; a waterproof circuit protection compartment; a circuit component; a folding and fixing component; a fastening component; and an extension rod; the circuit component is inserted into the waterproof circuit protection compartment; the extension rod is fixedly connected to the waterproof circuit protection compartment; the circuit component is electrically coupled to the detection coil disk; the detection coil disk is provided with a bracket provided with a first through-hole and a second through-hole; the fastening component is provided with a bolt and a fixing column; the waterproof circuit protection compartment is provided with a connector provided with a connection hole; the bolt penetrates the connection hole and the first through-hole in sequence, the fixing column penetrates the second through-hole; and the waterproof circuit protection compartment is selectively rotated around the bolt.

8 Claims, 9 Drawing Sheets

FOLDABLE PORTABLE METAL DETECTOR HAVING A QUICKLY REPLACEABLE DETECTION COIL DISK

BACKGROUND

1. Technical Field

The present disclosure relates to metal detection technology, and particularly to a foldable portable metal detector.

2. Description of Related Art

At present, for metal detections, metal detectors are commonly used detection tools. There are three main types of metal detectors of electromagnetic induction type, X-ray detection type, and microwave detection type, which are electronic instrument for detecting metals that can be applied to multiple technologies. For militaries, metal detectors can be used to detect metal mines; for securities, they can be used to detect weapons and crime tools that can be carried or hidden; for archeologies, they can be used to detect ancient tombs with buried metal objects so as to find gold and silver treasures, jewelry, or other metal products therein; for engineerings, they can be used to detect underground buried metal objects such as pipelines; for mineral explorations, they can be used to detect and find natural gold particles; and for industries, they can be used in online monitorings such as removing metal debris from cottons, coals, and foods.

At present, all of the detection coil disks of the existing handheld metal detectors in the market have fixed angles that cannot be adjusted. It needs to stoop when using a handheld metal detector to detect the ground. Most of the handheld metal detectors cannot be reformed for standing uses. Although there are hand-held detectors that can be reformed for standing uses, these detectors have a complicated structure while occupy large space, which are not convenient for storage and carrying. In the existing detection coil disks, there is a rotatable shaft of the handheld metal detector that is connected through a bolt. Although this structure has a low cost, it is not suitable for the signal transmission cables that are placed in the center. Generally, the detectors that have the cable connector on the outer side of the shaft are easy to damage the cables due to bumps. The detection coil disks of the existing mainstream metal detectors are divided into the following types: one of them cannot be folded and have a fixed angle, which are inconvenient to carry and use; another of them is foldable, but have the connection lines that are exposed and easily damaged, or is hidden in the tube but is far away from the main control detection module and the distortion rate of the signals is affected; the other of them can be folded and is without cables, while have complicated structure and large volume. These mainstream detectors also have problems such as difficult to replace and easy damage to cables when replacing the detection coil disk.

SUMMARY

In order to solve the above-mentioned problems, the present disclosure provides a foldable portable metal detector that allows the detection coil disk to be replaced in an easy and quick manner, which is convenient to fold and carry, and can be changed from handheld uses to standing uses.

The present disclosure is implemented through the technical solutions as follows.

The present disclosure provides a foldable portable metal detector. The foldable portable metal detector includes: a detection coil disk; a waterproof circuit protection compartment; a circuit component; a folding and fixing component; a fastening component; an extension rod; and a Bluetooth remote control component; where, the Bluetooth remote control component is configured to remotely control the foldable portable metal detector; the circuit component is inserted into the waterproof circuit protection compartment such that the circuit component can be selectively draw out from the waterproof circuit protection compartment; the extension rod is fixedly connected to a tail end of the waterproof circuit protection compartment and can be selectively removed from the waterproof circuit protection compartment; the circuit component is electrically coupled to the detection coil disk; the detection coil disk is provided with a bracket provided with a first through-hole and a second through-hole; the fastening component is provided with a bolt and a fixing column; the waterproof circuit protection compartment is provided with a connector provided with a connection hole; the bolt penetrates the connection hole and the first through-hole in sequence and is movably connected to the folding and fixing component, the fixing column penetrates the second through-hole; and the waterproof circuit protection compartment is selectively rotated around the bolt.

Furthermore, the bolt is provided with a first thread, and the folding and fixing component is lathed with a second thread, the folding and fixing component is selectively rotated to fix a rotational position of the waterproof circuit protection compartment through a matchingness of the first thread and the second thread.

Furthermore, the detector further includes a tail cover provided with a third thread, and the tail cover is fixedly connected to a tail end of the waterproof circuit protection compartment through the third thread.

Furthermore, the detector further includes a connecting and locking member including a stud, the tail cover includes a connection nut fixedly installed in the end, the stud is screwed into the connection nut, and the extension rod is fixedly locked on the connecting and locking member, such that the extension rod is fixedly connected to the waterproof circuit protection compartment.

Furthermore, the circuit component includes a connecting line, an audio socket connector, and a circuit board; a Bluetooth module is provided on the circuit board, and the Bluetooth module is fixedly installed on the circuit board to electrically connect to the circuit board; one end of the connection line is electrically connected to the detection coil disk, and the other end of the connection line is an audio plug connector; and the audio socket connector is mounted on the circuit board to electrically connect to the circuit board; and the audio plug connector is selectively inserted into the audio socket connector.

Furthermore, the circuit component further includes a mounting board, and the circuit board is fixedly mounted on the mounting board.

Furthermore, the circuit component further includes an upper case and a fixing case, and the fixing case is fixedly connected to both of the upper case and the mounting board.

Furthermore, the circuit component further includes a button penetrating the upper case to electrically connect to the circuit board.

Furthermore, the waterproof circuit protection compartment is further provided with a keycap and a pressing piece;

where when the circuit component is fixedly installed in the waterproof circuit protection compartment, an inner surface of the pressing piece is attached to the button, the waterproof circuit protection compartment wraps the waterproof circuit protection compartment, and the keycap is attached to an outer surface of the pressing piece.

Furthermore, the circuit component further includes a battery electrically connected to the circuit board.

The beneficial effects of the present disclosure:

In the present disclosure, it provides the foldable portable metal detector with the detection coil disk and the waterproof circuit protection compartment that can be rotated with respect to each other, such that the detection coil disk can be folded with respect to the waterproof circuit protection compartment, which saves transportation spaces when transporting the detector and is convenient for users to carry. When the detector is unfolded, it has a longer length than similar products in the market and is more suitable for faster large-area scanning works. Both sides of the connector of the waterproof circuit protection compartment are provided with one folding and fixing component. By adopting the structure of locking on both sides, the bolt is assembled with the connector from an inner side of the bracket on the detection coil disk in an outward manner, and the folding and fixing component is connected with the bolt at the outer side of the bracket, so as to provide an axial-directional rotational space for cables. This structure can avoid the waterproof circuit protection compartment to wear the cables during rotation, and the folding and fixing component will not automatically fall off from the bolt due to the relative movement between the waterproof circuit protection compartment and the detection coil disk. The audio socket connector is used to electrically connect the detection coil disk to the circuit component, so as to allow the quickly replacing of the detection coil disk. The tail end of the waterproof circuit protection compartment is provided with the tail cover, and the extension rod can be connected to the tail cover, so as to change the hand-held detector into the detector for standing use. The Bluetooth module is installed in the circuit component, so that the switching on/off and functional configurations of the detector can be realized by connecting the Bluetooth module to a Bluetooth switch.

DETAILED DESCRIPTION

In order to explain the technical solutions of the present disclosure more clearly and completely, they will be further described below with reference to the drawings.

As shown in FIG. 1-FIG. 9, in this embodiment, a foldable portable metal detector is provided. The foldable portable metal detector includes: a detection coil disk 10, a waterproof circuit protection compartment 20, a circuit component 26, a folding and fixing component 18, a fastening component 14, an extension rod 40, and a Bluetooth remote control component 81. Where, the Bluetooth remote control component 81 is configured to remotely control the foldable portable metal detector; the circuit component 26 is inserted into the waterproof circuit protection compartment 20 such that the circuit component 26 can be selectively draw out from the waterproof circuit protection compartment 20; the extension rod 40 is fixedly connected to a tail end of the waterproof circuit protection compartment 20 and can be manually removed from the waterproof circuit protection compartment 20; the circuit component 26 is electrically coupled to the detection coil disk 10; the detection coil disk 10 is provided with a bracket 11 that is provided with a first through-hole 12 and a second through-hole 13; the fastening component 14 is provided with a bolt 15 and a fixing column 16; the waterproof circuit protection compartment 20 is provided with a connector 21 that is provided with a connection hole 22; the bolt 15 penetrates the connection hole 22 and the first through-hole 12 in sequence and is movably connected to the folding and fixing component 18, the fixing column 16 penetrates the second through-hole 13; and the waterproof circuit protection compartment 20 can be rotated with the fixing column 16 as a rotation axis. The bolt 15 is provided with a first thread, and the folding and fixing component 18 is lathed with a second thread 19, the folding and fixing component 18 can be rotated to fix a rotational position of the waterproof circuit protection compartment 20 through a matchingness of the first thread and the second thread 19.

Figure 1:
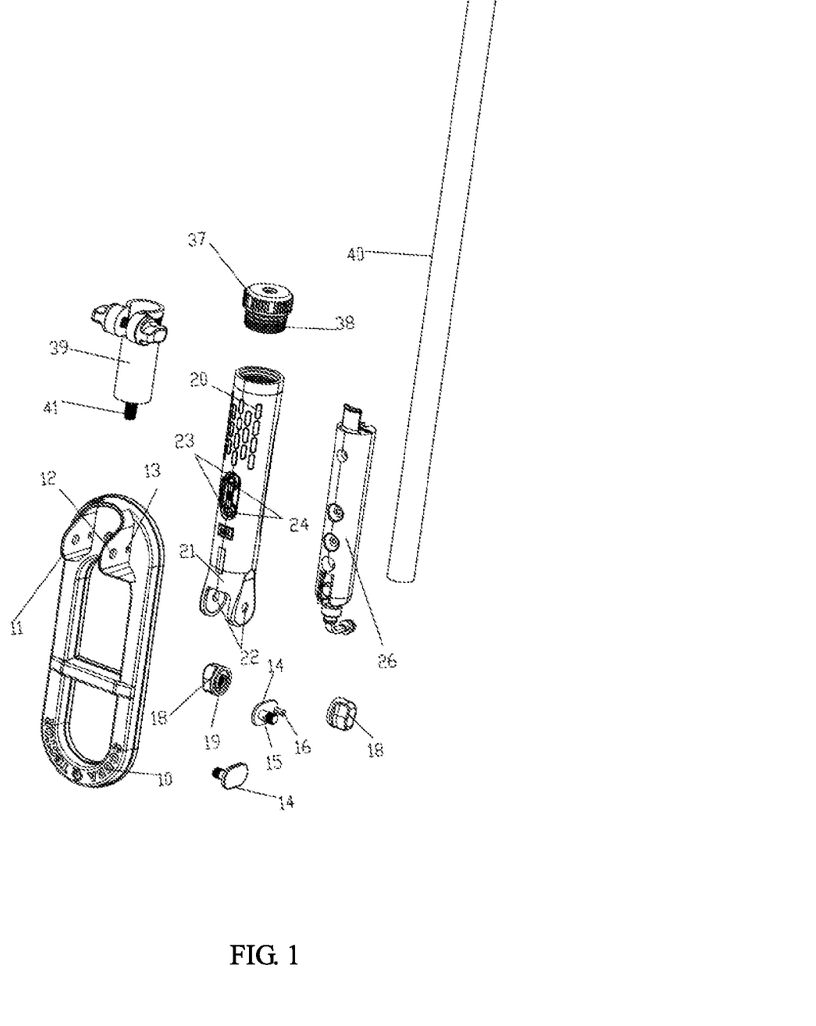
FIG. 1 is an overall exploded view of a foldable portable metal detector according to an embodiment of the present disclosure.
Figure 5:
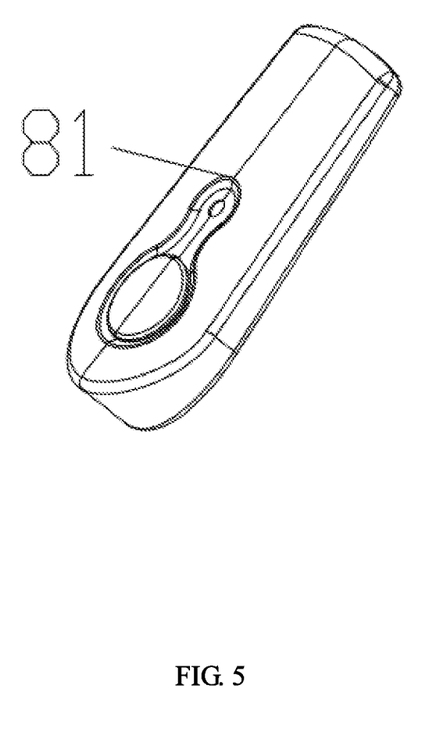
FIG. 5 is a schematic view of the structure of a Bluetooth remote control component according to an embodiment of the present disclosure.
Figure 6:
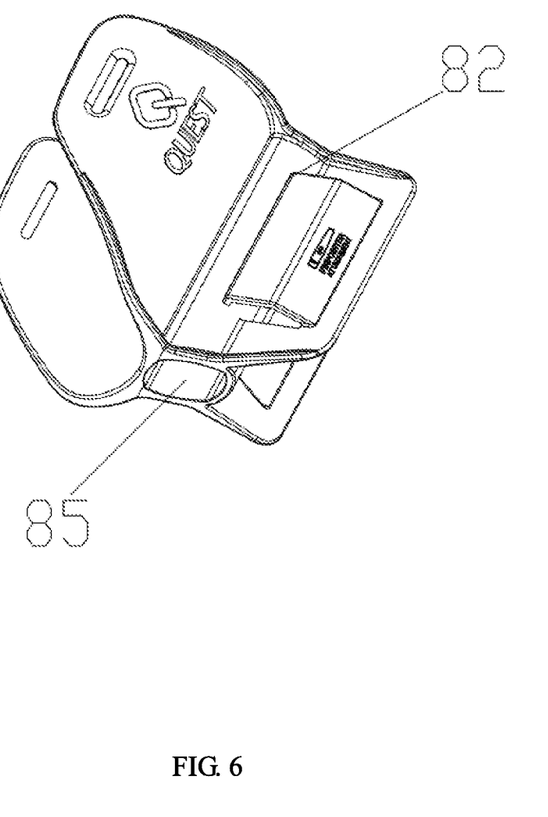
FIG. 6 is a schematic view of an elbow pad according to an embodiment of the present disclosure.
Figure 7:
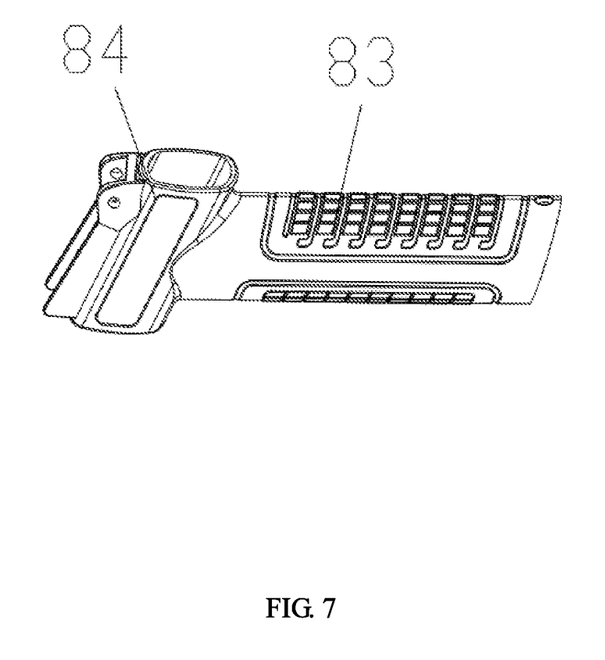
FIG. 7 is a schematic view of a handle according to an embodiment of the present disclosure.
Figure 8:
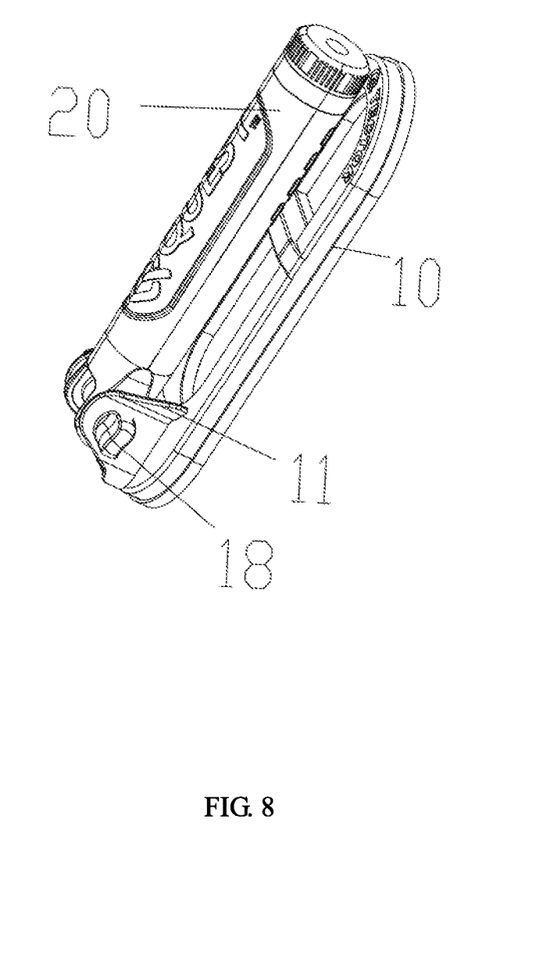
FIG. 8 is a schematic view of a folded state according to an embodiment of the present disclosure.
Figure 9:
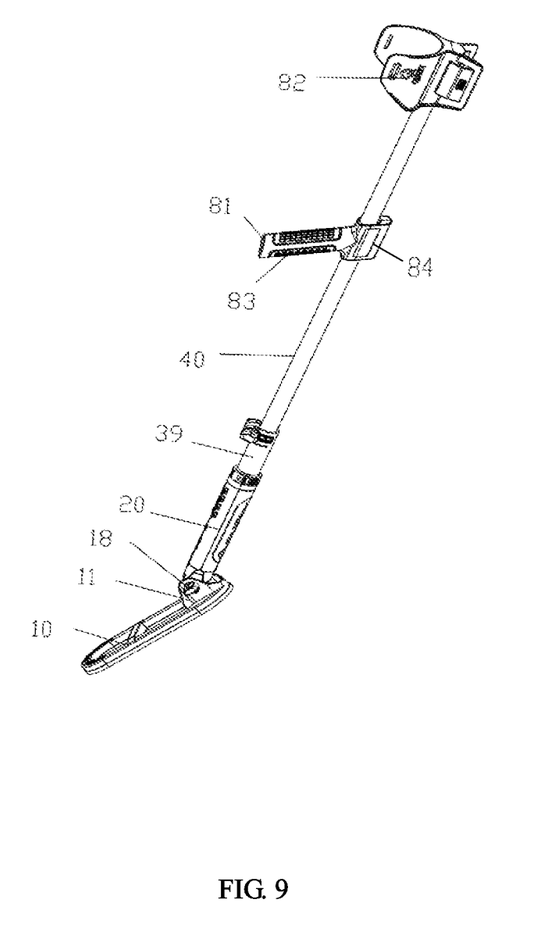
FIG. 9 is a schematic view of a use state according to an embodiment of the present disclosure.

In this embodiment, the detection coil disk 10 is provided with two pieces of the bracket 11. The bracket 11 is provided with the first through-hole 12 and the second through-hole 13, and the connector 21 is a two-sided connecting plate with a hollow structure, where the connecting plate is provided with connecting holes 22, and there are two fastening components 14. The fastening components 14 are fixed from an inner side of the bracket 11 in an outward manner to pass through the connection hole 22 and the first through-hole 12, the folding and fixing component 18 is screwed with the bolt 15. Since the bolt 15 is lathed with the first thread and the folding and fixing member 18 is lathed with the second thread 19, the detection coil disk 10 and the waterproof circuit protection compartment 20 can be fixed at a specified relative position by rotating the folding and fixing component 18, and such a structure can also allow the portable metal detector to be folded up and easy to carry and store. The detection coil disk 10 is an oval disk, where a detection coil is installed inside the detection coil disk 10. The circuit component 26 and the detection coil disk 10 are connected through a flexible cable so as to transmit detection signals. One end of the cable of the detection coil disk 10 is an audio plug that is connected to the audio socket of the circuit component 26 by inserting. By connecting through the audio plug and the audio socket, the electrical connection between the circuit component 26 and the detection coil disk 10 can be realized in a more convenient manner, and other detection coil disk can replace the detection coil disk 10 conveniently, too. The foldable portable metal detector is further provided with an armrest 82 and a handle 83. A connection tube 84 is provided on the handle 83. The handle 83 can be fixedly installed on the extension rod 40 through fixedly connecting the connection tube 84 to the extension rod 40, and the Bluetooth remote control component 81 can be mounted on the handle 83 so that the Bluetooth remote control component 81 can remotely control the foldable portable metal detector. The armrest 82 is provided with a fixing tube 85 which can be fixedly installed at a tail end of the extension rod 40. The installation of the armrest 82 and the handle 83 allows the foldable portable metal detector to be used in a better manner when it is installed with the extension rod 40.

Furthermore, the foldable portable metal detector further includes a connecting and locking member 39. The connecting and locking member 39 includes a stud 41. The tail cover 37 includes a connection nut 38 fixedly installed on the tail cover 37, the stud 41 is screwed into the connection nut 38, and the extension rod 40 is fixedly locked on the connecting and locking member 39, such that the extension rod 40 is fixedly connected to the waterproof circuit protection compartment 20. The third thread is provided on an outer periphery of the connection nut 38.

In this embodiment, the extension rod 40 can be fixedly locked on the connecting and locking member 39, and the connecting and locking member 39 is screwed to the tail cover 37 through the stud 41. This connection manner is simple and convenient, so that the extension rod 40 can be installed on the waterproof circuit protection compartment 20 in a faster manner.

Figure 2:
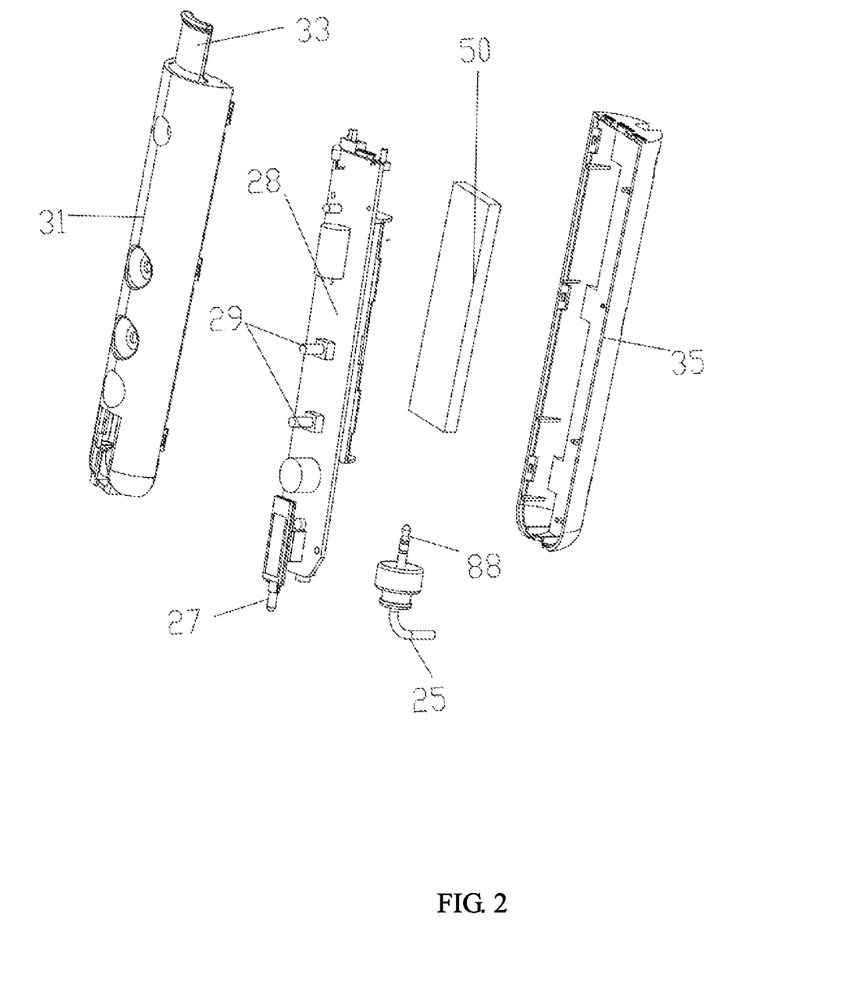
FIG. 2 is an exploded view of a circuit component according to an embodiment of the present disclosure.
Figure 3:
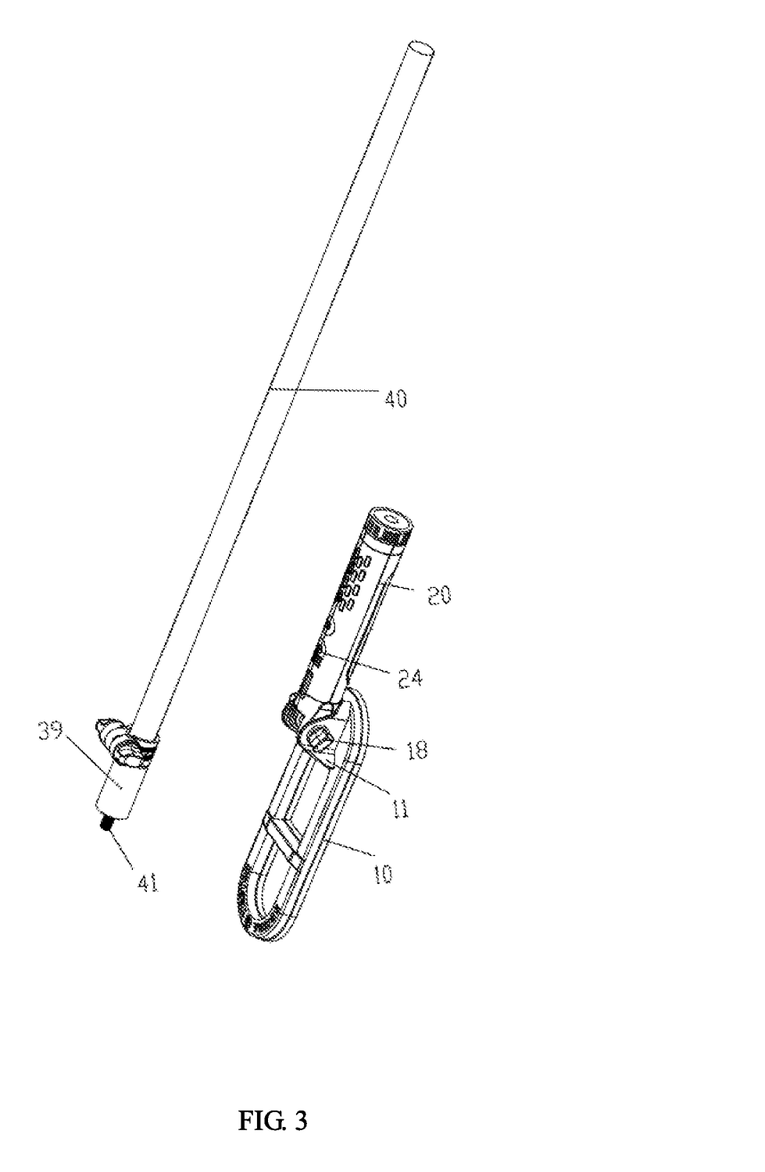
FIG. 3 is a schematic view of a use state of a foldable portable metal detector according to an embodiment of the present disclosure.
Figure 4:
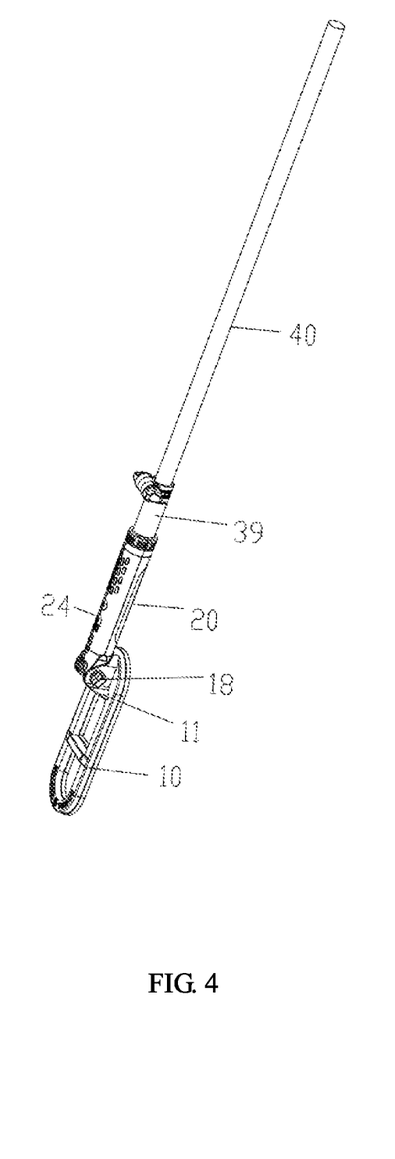
FIG. 4 is a schematic view of the structure of a foldable portable metal detector according to an embodiment of the present disclosure.

Furthermore, the circuit component 26 includes a connecting line 25, an audio socket connector 27, and a circuit board 28. A Bluetooth module is provided on the circuit board 28, and the Bluetooth module is fixedly installed on the circuit board 28 to electrically connect to the circuit board 28. One end of the connection line 25 is electrically connected to the detection coil disk 10, and the other end of the connection line 25 is an audio plug connector 88. The audio socket connector 27 is mounted on the circuit board 28 to electrically connect to the circuit board 28. The audio plug connector 88 can be inserted into the audio socket connector 27 and detached therefrom.

In this embodiment, through using the audio socket connector 27 and the audio plug connector 88, it allows the circuit component 26 to be detached from the detection coil disk 10 quickly, so that the detection coil disk 10 can be replaced in a quick manner. A Bluetooth switch is provided on the extension rod 40. The Bluetooth switch 40 can be connected with the Bluetooth module, so that on and off of the foldable portable metal detector can be controlled through the Bluetooth switch. When using the foldable portable metal detector with the extension rod 40 connected therewith, there is no necessary to bend down to press a button 29 on the waterproof circuit protection compartment 20.

Furthermore, the circuit component 26 further includes a mounting board 35, and the circuit board 28 is fixedly mounted on the mounting board 35. The circuit component 26 further includes an upper case 31 and a fixing case 33, and the fixing case 33 is fixedly connected to both of the upper case 31 and the mounting board 35. The circuit component 26 further includes the button 29. The button 29 penetrates the upper case 31 to electrically connect to the circuit board 28. The waterproof circuit protection compartment 20 is further provided with a keycap 24 and a pressing piece 23. When the circuit component 26 is fixedly installed in the waterproof circuit protection compartment 20, an inner surface of the pressing piece 23 is attached to the button 24, the waterproof circuit protection compartment 20 wraps the circuit 26, and the keycap 24 is attached to an outer surface of the pressing piece 23. The circuit component 26 further includes a battery 50. The battery 50 is electrically connected to the circuit board 28.

In this embodiment, the installation and cooperation among the upper case 31, the mounting board 28, the fixing case 33, and the battery 50 makes the overall structure of the circuit component 26 more compact, so as to reduce the space occupation of the foldable portable metal detector.

Of course, the present disclosure may have other embodiments. Other embodiments obtained by those skilled in the art based on this embodiment without creative efforts are within the scope of the present disclosure.

What is claimed is:
1. A foldable portable metal detector, comprising:
a detection coil disk;
a waterproof circuit protection compartment;
a circuit component;
a folding and fixing component;
a fastening component;
an extension rod; and
a Bluetooth® remote control component;
wherein, the Bluetooth® remote control component is configured to remotely control the foldable portable metal detector; the circuit component is inserted into the waterproof circuit protection compartment such that the circuit component is selectively drawn out from the waterproof circuit protection compartment; the extension rod is fixedly connected to a tail end of the waterproof circuit protection compartment and is selectively removed from the waterproof circuit protection compartment; the circuit component is electrically coupled to the detection coil disk; the detection coil disk is provided with a bracket provided with a first through-hole and a second through-hole; the fastening component is provided with a bolt and a fixing column; the waterproof circuit protection compartment is provided with a connector provided with a connection hole; the bolt penetrates the connection hole and the first through-hole in sequence and is movably connected to the folding and fixing component, the fixing column penetrates the second through-hole; and the waterproof circuit protection compartment is selectively rotated around the bolt further comprising a tail cover provided with a third thread, and the tail cover is fixedly connected to a tail end of the waterproof circuit protection compartment through the third thread; further comprising a connecting and locking member comprising a stud, wherein the tail cover comprises a connection nut fixedly installed on the tail cover, the stud is screwed into the connection nut, and the extension rod is fixedly locked on the connecting and locking member, such that the extension rod is fixedly connected to the waterproof circuit protection compartment.

2. The foldable portable metal detector according to claim 1, wherein the bolt is provided with a first thread, and the folding and fixing component is lathed with a second thread, the folding and fixing component is selectively rotated to fix a rotational position of the waterproof circuit protection compartment through a matchingness of the first thread and the second thread.

3. The foldable portable metal detector according to claim 1, wherein the circuit component comprises a connecting line, an audio socket connector, and a circuit board; a Bluetooth® module is provided on the circuit board, and the Bluetooth® module is fixedly installed on the circuit board to electrically connect to the circuit board; one end of the connection line is electrically connected to the detection coil disk, and the other end of the connection line is an audio plug connector; and the audio socket connector is mounted on the circuit board to electrically connect to the circuit board; and the audio plug connector is selectively inserted into the audio socket connector.

4. The foldable portable metal detector according to claim 3, wherein the circuit component further comprises a mounting board, and the circuit board is fixedly mounted on the mounting board.

5. The foldable portable metal detector according to claim 4, wherein the circuit component further comprises an upper case and a fixing case, and the fixing case is fixedly connected to both of the upper case and the mounting board.

6. The foldable portable metal detector according to claim 5, wherein the circuit component further comprises a button penetrating the upper case to electrically connect to the circuit board.

7. The foldable portable metal detector according to claim 6, wherein the waterproof circuit protection compartment is further provided with a keycap and a pressing piece; wherein when the circuit component is fixedly installed in the waterproof circuit protection compartment, an inner surface of the pressing piece is attached to the button, the waterproof circuit protection compartment wraps the circuit component, and the keycap is attached to an outer surface of the pressing piece.

8. The foldable portable metal detector according to claim 7, wherein the circuit component further comprise a battery electrically connected to the circuit board.

* * * * *